United States Patent [19]

Gerber et al.

[11] Patent Number: 5,093,550
[45] Date of Patent: Mar. 3, 1992

[54] HOLDING DEVICE AND METHOD FOR TREATING WAFER-LIKE OBJECTS, AND A METHOD OF TREATING THEM

[75] Inventors: Hans A. Gerber; Georg Hochgesang; Alfred Pardubitzki, all of Burghausen; Manfred Schmiedlindl, Burgkirchen; Werner Zipf, Toging; Arthur Schweighofer, Burghausen, all of Fed. Rep. of Germany

[73] Assignee: Wacker-Chemitronic Gesellschaft fur Elektronic-Grundstoffe mbH, Burghausen, Fed. Rep. of Germany

[21] Appl. No.: 506,958

[22] Filed: Apr. 10, 1990

[30] Foreign Application Priority Data

Jun. 15, 1989 [DE] Fed. Rep. of Germany ....... 3919611

[51] Int. Cl.5 ............................................. B23K 26/00
[52] U.S. Cl. ................................................ 219/121.69
[58] Field of Search ....................... 219/121.68, 121.69, 219/121.6, 121.85, 390, 405, 411; 228/101; 432/258, 259; 118/728, 725, 50.1

[56] References Cited

U.S. PATENT DOCUMENTS

| 309,680 | 12/1884 | Bapterosses | 432/259 |
| 4,407,654 | 12/1983 | Irwin | 432/259 X |
| 4,955,808 | 9/1990 | Miyagawa | 432/253 X |

Primary Examiner—C. L. Albritton
Attorney, Agent, or Firm—Burgess, Ryan & Wayne

[57] ABSTRACT

A wafer holding device including a frame (2) which surrounds a wafer (1) which is received without contact, which can be moved with the wafer having at least three holding elements (3) which are directed toward the outside circumference of the wafer and which can be changed from a holding position to a release position. The wafer can be supported in the holding device during many steps associated with movement in the production process so that a multiplicity of gripping and release operations which stress the wafer surface are unnecessary.

14 Claims, 2 Drawing Sheets

HOLDING DEVICE AND METHOD FOR TREATING WAFER-LIKE OBJECTS, AND A METHOD OF TREATING THEM

BACKGROUND OF THE INVENTION

1. FIELD OF THE INVENTION

The invention relates to a holding device for wafer-like objects, in particular, semiconductor wafers, having a frame at least partially surrounding the wafer without contact and holding elements originating from the frame and acting on the wafer. The invention also relates to a method of treating semiconductor wafers in which the wafers pass through at least one process step or a sequence of process steps comprising one or more transport operations.

2. RELATED ART

In the production on of semiconductor wafers as starting materials for electronic components or solar cells, the wafers are subjected to a series of process steps during, before and/or after which the wafers are transported. In particular, the wafers are subject to inspection operations in which the wafer surfaces are examined for properties such as, for example, geometrical perfection, particle freedom or chemical purity, and identification operations in which the wafers are provided, for example, with markings or inscriptions before they are delivered to the final packaging and are made ready for shipment.

Hitherto, special gripping devices such as, for instance, vacuum pickups or gripping tongs having a frame partially surrounding the wafers without contact and manually operated holding elements acting on the outside circumference of the wafers have been employed for holding and transporting wafers in such operations.

Vacuum pickup, like wafer transport, by means of transport bells, has the disadvantage that even gentle contact with the wafer surface leads to defects. The defects can be rendered visible, for example, with the aid of particle measurements or particular etching solutions. The pattern reveals the track of the transport belt or the vacuum pickup on the wafer surface. Although known gripping tongs avoid this disadvantage, they are difficult to operate as they must be precisely positioned for gripping, which is not feasible in the long term. In addition, the gripping tongs are unwieldly and like vacuum pickups, are suitable only for localized use. The known gripping tongs are not suitable for more extensive transport paths, so the wafers have to be picked up at different points of treatment and have to be passed on. In each of these gripping operations, there is the risk of damage to the sensitive wafers.

The object of the invention is to provide a holding device which makes possible the gentle, simple and reliable pick-up and release of wafer-like objects in particular, semiconductor wafers, and makes it possible to reduce the number of gripping operations necessary.

BRIEF DESCRIPTION OF THE INVENTION

The object of the invention is achieved by a holding device which comprises a frame which can be transported jointly with the wafer and which has at least three holding elements directed tangentially and/or radially toward the outside circumference of the wafer which can be changed from a holding position to a release position.

The frame may be designed, for example, in the form of a ring or a perforated disk, the internal hole having a larger diameter than the outside diameter of the wafer to be held. Although such a circular or annular geometry of the frame is preferred, it is not critical. Embodiments having polygonal, for example, triangular, square or, in particular, a hexagonal or octagonal outside and/or inside circumference can be used. Preferably, the frame is closed and surrounds the entire outside circumference of the wafer. In principle, open frames are, however, not excluded, provided they are mechanically rigid enough to ensure a sufficiently reliable holding of the wafers. According to experience, it is sufficient if the wafer is surrounded at least about 3/5 of its outside circumference by the frame. However, such open frames are often more sensitive to torsion loads than closed frames.

Preferably, the frame is manufactured from a plastic which has the necessary mechanical rigidity and is inert to the process conditions and chemicals and does not cause unacceptable contamination of the wafers. Examples of suitable plastics are thermoplastics such as polytetrafluoroethylene, polyethylene, polyvinyl chloride or, in particular, thermosetting plastics such as phenolic, epoxy or polyester resins. The plastics may be reinforced with fibers such as glass or carbon fibers, or the application or introduction of rigidizing layers. It is also possible to use a ceramic or metal base such as stainless steel, aluminum or a non-ferrous metal provided with a plastic casing. Of course, in choosing such a composite, the applicable purity requirements and risks of contamination have to be considered.

BRIEF DESCRIPTION OF THE DRAWINGS

Analogous components are labelled with the same reference symbols in the two figures.

DETAILED DESCRIPTION OF THE INVENTION

Figure 1:
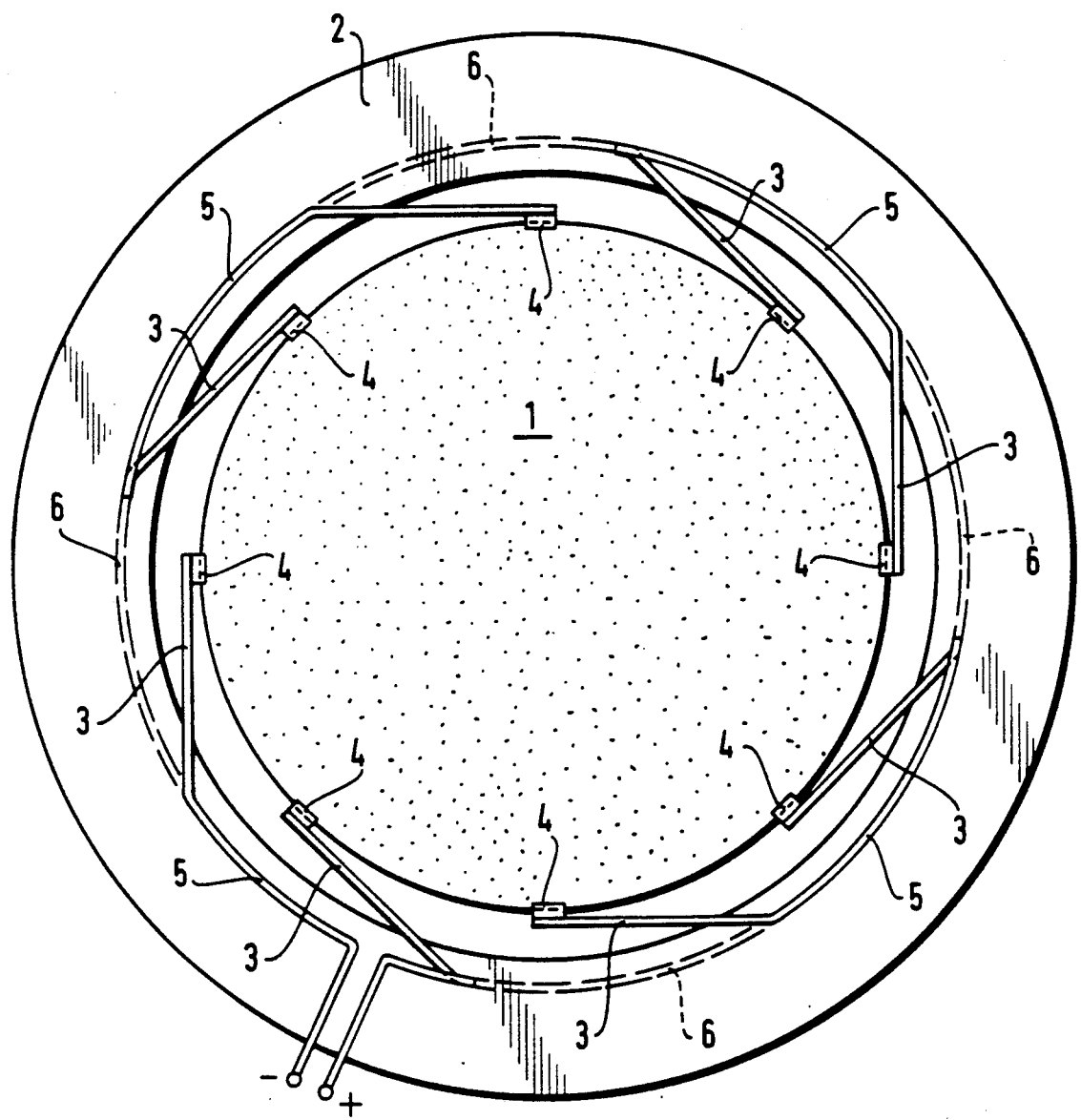
FIG. 1 is an illustration of a holding device having therbmobimetallic spring tongs as holding elements.
Figure 2:
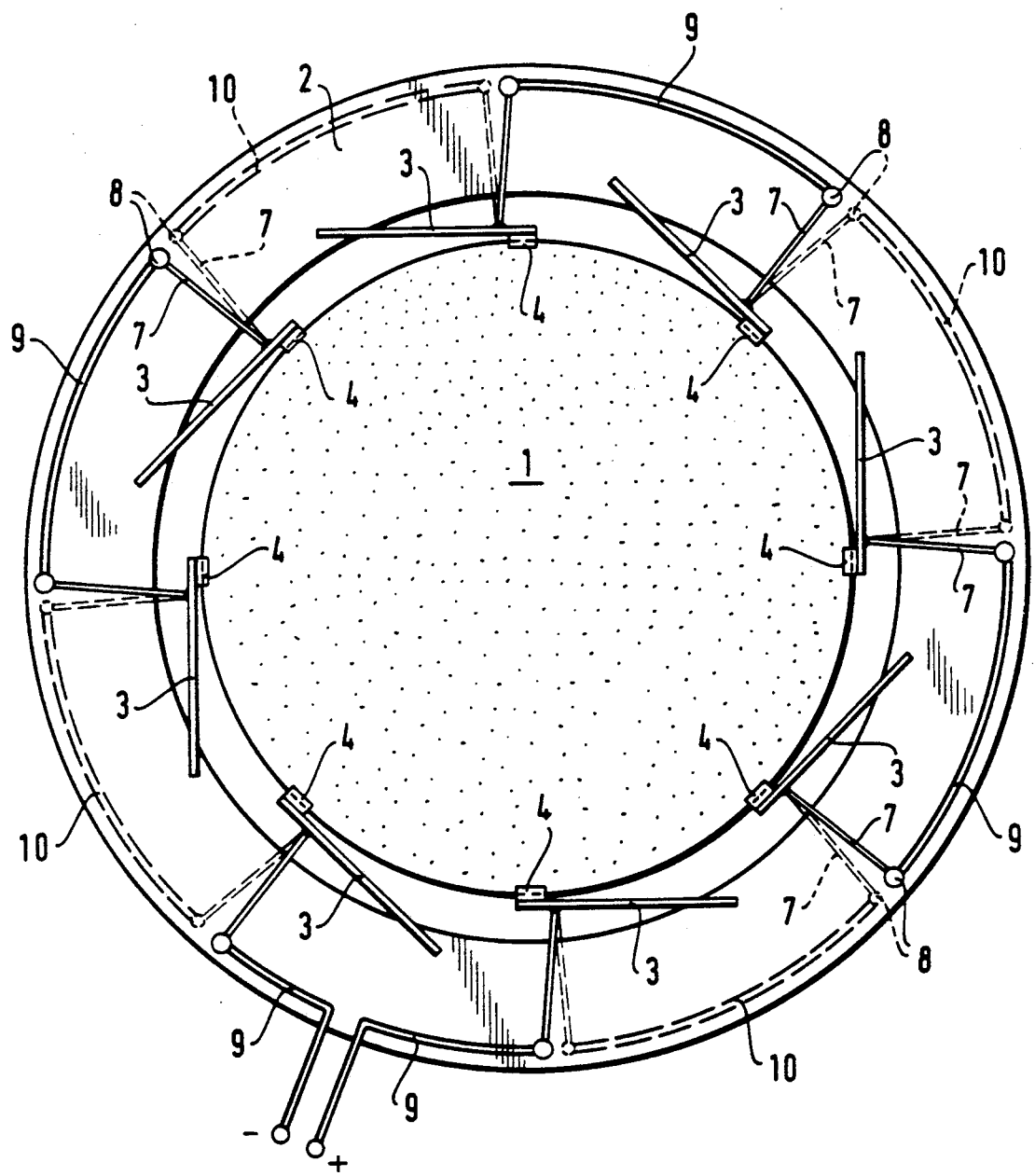
FIG. 2 illustrates a holding device having holding elements which be changed from the holding to the release position by wires which contract by the action of heat.

The holding devices shown in FIGS. 1 and 2 receive a wafer 1 which may be a semiconductor material such as silicon, germanium, gallium arsenide or indium phosphide or, for example, a material such as glass, an oxide material such as gallium-gadolinium-garnet, spinel or ruby, or other materials having sensitive surfaces. The holding devices of the invention are particularly useful in transporting and handling wafers for optical or magnetic memories, semiconductors or any materials which have sensitive surfaces.

In FIG. 1, the wafer is surrounded without contact by an annular flat frame 2 preferably made of plastic. The width of the annular gap between the frame and the wafer which can contain recesses or constrictions, may be varied within wide limits. The lower limit of the gap width depends on the free path length which is required by the holding elements for conversion to a release position suitable for satisfactory wafer pick-up. The upper limit is dependent on the requirements of the particular field of application. Consideration should be given to the requirement for surface treatment with various reagents in a particular manner or accessibility of the surface for cleaning or measurement operations.

In the production of semiconductor wafers, the use of plastic frames having a gap width in the range of about 25 to 50 mm and a thickness of about 3 to 8 mm has proved useful.

Mounted in frame 2 are the ends of holding elements 3, which are directed tangentially toward the outside circumference of the wafer. In the holding position shown, the free end regions of the holding elements contact the wafers at their outside circumference and fix the wafers in position. To avoid contamination of the wafer, the holding elements are preferably provided, at least in the end region, with supporting pieces 4 which comprise the same material as the wafer. That is, the supporting pieces are high-purity silicon or gallium arsenide if it is intended to receive silicon or gallium arsenide wafers. It is also possible to use suitably doped material. The supporting pieces can be mounted on the holding elements for example, by gluing. Preferably, the supporting pieces have a profile which is shaped to fit the outside edge of the wafer. The supporting pieces can be rounded in a suitably concave manner in the region which comes into contact with the wafer if the wafer has a rounded periphery.

The number of holding elements required is at least three. It has, however, been found that in the case of semiconductor wafers with a diameter in the range of from about 10 cm and greater, a particularly reliable and rigid holding and release of the wafers can be achieved with about 6 to 10, preferably 8, holding elements. Preferably, the holding elements are distributed in a rotationally symmetrical manner over the inside circumference of the frame.

It has proved satisfactory to design the holding elements as spring tongs. Preferably, the spring tongs are prestressed with respect to the wafer to be held so that the force with which the wafer is held in the holding position is preset. In principle, it is possible to provide holding elements and, in particular, spring tongs which are changed by manually exerted mechanical forces from the holding to the release position, and vice versa. However, holding elements, in particular, spring tongs, which can be changed from the holding position to the release position with the aid of electric current are used according to the preferred embodiment of the invention. The change in position can be achieved by aid of electric current by fabricating the spring tongs of slotted, end-bridged strips of a therbmobimetallic element which heat up and bend when current passes through them and release the wafer. This can be achieved in a manner shown diagrammatically in FIG. 1, wherein current conductors 5 and 6 which connect the holding elements 3, designed as slotted spring tongs in series are provided on the front and back of the frame 2. If electrical energy is now fed into the system, the therbmobimetallic springs, through which current flows, heat up and bend out of the holding position, shown in the current-free, cold state in FIG. 1, outward into the release position corresponding to the heated state. The clamped wafer 1 is released and can be removed or deposited.

To clamp a wafer, current is first applied to the bimetallic elements to bring the therbmobimetallic spring tongs into the release position. The wafer to be received is placed in the center of the device in the position provided and the current supply is cut off. The bimetallic spring tongs cool and gradually return to the holding position, in which process, they make contact with the wafer and on further cooling, build up the holding force. The reliable seating of the wafer in the mounting is ensured and the wafer and holding device can be jointly moved to carry out treatment operations or process steps such as measurements and/or laser inscription, without wafer removal.

Another embodiment of the invention can be constructed as shown in FIG. 2. Here, spring tongs 3 made of a resiliently rigid material, for example, a metal such as spring steel, beryllium metal or beryllium alloys, or resiliently rigid plastics is mounted in the frame 2, which spring tongs point tangentially at the outside circumference of the wafer. The spring tongs are preferably provided with supporting pieces 4 which comprise wafer material and which are matched to the wafer edge shape in their cross-section. The spring tongs are prestressed in a manner such that they can exert the necessary holding force on the edge of wafer 1 in the holding position. Conversion to the release position is achieved by means of pull wires 7 which shorten on being heated. This property is possessed by certain alloys, in particular, nickel/titanium alloys which are known as "shape memory alloys" such as the alloy designated "Nitinol" (KirkOthmer, Encyclopedia of Chemical Technology (3) 20: 726–736). An example of a particularly useful alloy is the titanium/nickel alloy marketed under the designation "Biometal".

Wires composed of such alloys contract on being electrically heated and are consequently able to pull the spring tongs outward in the present case. Preferably, means to prestress these pull wires which are made, for example, of the titanium/nickel alloy designated "Biometal", are provided. Tensioning elements 8 such as set screws or eccentrics, are provided so that the length of the pull wires can be precisely adjusted. To supply electric current, the pull wires may, for example, be connected to conductor tracks 9 and 10 extending over the front or back of the frame, a series circuit preferably is used.

An arrangement in which a single pull wire is connected to each spring tong has also proved satisfactory, the spring tong then being included in the electric circuit. In order to ensure the necessary working length during the contraction of the pull wires, they can be arranged in coiled form.

The wafer is received or released analogously to the procedure described in the explanation of FIG. 1, with the difference that the spring tongs are brought from the holding position to the release position by the electrically heated pull wires. The current can be introduced at any point via the conductor tracks.

In addition to the preferred embodiments illustrated, holding devices in which the holding elements are mounted in an articulated manner and can be converted to the release position, with the aid of compression springs acting on the end away from the wafer, can be used. Another embodiment is to open up the holding elements from the holding position to the release or receiving position by means of external opening means. In addition to the embodiments in which the holding elements are directed tangentially toward the outside circumference of the wafer while the holding force acts radially on the wafer which are notable for a particularly rigid wafer positioning, embodiments are also possible in which the holding elements are directed radially toward the outside circumference of the wafer. For example, the frame 2 can be provided with recesses in which compression springs directed radially toward the center point of the wafer are fitted, which compression springs press in turn on the actual holding pins at the wafer edge. To receive or release the wafers, the holding pins are pulled outward into the release position, for example, mechanically or by means of pull wires or magnets. Such holding devices are, however, more expensive to produce, particularly if slight movements and vibrations of the supported wafer are to be eliminated.

The holding device according to the invention makes possible the safe and reliable handling of semiconductor wafers. The device of the invention eliminates defects in the wafer surface by the holding elements acting on the outside circumference of the wafer and also provides precise centering relative to the frame of the wafers. An advantage of the device is that the wafers supported in the holding device are held at a defined potential so that a build-up of electrostatic charges can be prevented. A further advantage is the simple handling and the versatility, since the holding device can be loaded and unloaded and also transported both manually and by machine. A further development of the inventive idea provides for the frame to be designed to be capable of stacking, for example, as a result of suitable shaping, so that the holding devices together with the wafers can be temporarily stored between individual process steps or shipping.

A major advantage of the holding device of the invention is that it can support the wafer through various transport and process steps and consequently, the number of loading and release operations can be markedly reduced. The holding device is used with particular advantage in manufacturing semiconductor wafers. The device is particularly useful in the manufacturing steps after the wafers have passed through the mechanical and chemical treatment steps (such as, for example, polishing, etching or cleaning operations), and are being prepared for packaging and shipment. At this stage, the wafers such as visual inspection or measurements of particles, resistance or geometry. It is also possible to provide an inscription on the supported wafer using laser equipment and/or a defined orientation. All these process steps and the transport operations associated with them can be carried out with the wafers supported in the holding device without removal being necessary.

The wafers are free of defects on the surface region caused by belt transport and/or vacuum pickups. The transport and handling systems which are standard in semiconductor technology and with which aid the wafer can be brought to a position in which the wafer circumference is accessible for the application of the holding elements are, for example, suitable for transferring a wafer to, or accepting in it, the holding device. In this process, the holding device with the holding elements in the release position can be held, for example, by means of positioning pins, gripping devices or other holding or positioning systems in a suitable relative position with respect to the wafer until the holding elements have changed to the holding position. The holding device can then be removed jointly with the wafer and delivered to the next process step. In an analogous manner, when a wafer is being released, the holding device can be brought to a suitable relative position with respect to the system provided for receiving the wafer, after which the holding elements are moved to the release position, for example, by means of current passage, and the wafer can be released. The holding device can then be used again at another point for receiving a wafer.

What is claimed is:

1. A holding device for receiving wafer-like objects having a frame, at least partially surrounding the wafer without contact, and holding elements originating from the frame and acting on the wafer and being changable from a wafer-holding position to a wafer-releasing position, said device comprising said frame (2) which can be transported jointly with the wafer (1) having at least three holding elements (3) directed towards and being in contact primarily with the outside circumference of the wafer when in the wafer-holding position.

2. The holding device as claimed in claim 1, comprising from about 6 to about 10 holding elements.

3. The holding device as claimed in claim 1, comprising an annular frame (2).

4. The holding device as claimed in claim 1, wherein the surfaces of the holding elements which come into contact with the wafers are provided with supporting pieces (4) comprised of the material of which the wafers are comprised.

5. The holding device as claimed in claim 1, wherein spring tongs are provided as holding elements.

6. The holding device of claim 1, wherein spring tongs which can be changed from the holding position to the release position by the action of an electric current are provided as holding elements.

7. A method of processing semi-conductor wafers comprising:
  (a) gripping the wafers primarily by their outside circumference in a holding device; and
  (b) transporting the wafers to or from at least one semi-conductor process step while said wafers are gripped at their outside circumference in said holding device.

8. The method as claimed in claim 7 wherein the wafers remain in the holding device during at least one process step.

9. The method as claimed in claim 8, wherein the at least one process step is an optical surface examination.

10. The method as claimed in claim 8, wherein the at least one process step is an inscription of the wafer by means of a laser beam.

11. A device of claim 6, wherein the spring, tongs comprise thermobimetallic elements.

12. A device of claim 11, wherein the temperature of the thermobimetallic elements is increased by passing an electric current through the thermobimetallic elements which causes the spring tongs to move to the release position.

13. A device of claim 6, wherein the spring tongs are moved to a release position by heating of an element attached to the tongs, which length shortens with an increase in temperature.

14. A device of claim 6, wherein the element which shortens with an increase in temperature is heated by passing an electric current through the element to shorten the element and release the spring tong from the wafer.

* * * * *